(12) United States Patent
Niitsuma

(10) Patent No.: US 9,419,599 B2
(45) Date of Patent: Aug. 16, 2016

(54) SEMICONDUCTOR INTEGRATED CIRCUIT, APPARATUS INCLUDING SEMICONDUCTOR INTEGRATED CIRCUIT, AND METHOD FOR CONTROLLING CLOCK SIGNAL IN SEMICONDUCTOR INTEGRATED CIRCUIT

(71) Applicant: CANON KABUSHIKI KAISHA, Tokyo (JP)

(72) Inventor: Hiroaki Niitsuma, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/853,676

(22) Filed: Sep. 14, 2015

(65) Prior Publication Data

US 2016/0087617 A1    Mar. 24, 2016

(30) Foreign Application Priority Data

Sep. 18, 2014   (JP) ................................. 2014-190390

(51) Int. Cl.
*H03K 21/00* (2006.01)
*H03K 5/135* (2006.01)
*H03K 5/00* (2006.01)

(52) U.S. Cl.
CPC ...... *H03K 5/135* (2013.01); *H03K 2005/00286* (2013.01)

(58) Field of Classification Search
CPC .................. H03K 5/135; H03K 2005/00286; G11C 11/4076
USPC ................. 327/115, 117, 118, 114, 113, 141, 327/144–147, 162, 163, 231–237, 1, 2, 3, 7, 327/8; 365/233.11
See application file for complete search history.

(56) References Cited

U.S. PATENT DOCUMENTS

| | | | | | |
|---|---|---|---|---|---|
| 5,939,911 | A | * | 8/1999 | Humphreys | H03L 3/00 327/115 |
| 6,194,932 | B1 | * | 2/2001 | Takemae | G06F 1/10 327/141 |
| 6,212,127 | B1 | * | 4/2001 | Funaba | G11C 7/1072 365/194 |
| 7,187,217 | B2 | * | 3/2007 | Marutani | H03K 23/64 327/115 |
| 7,239,575 | B2 | * | 7/2007 | Kim | G11C 7/1012 327/146 |
| 2016/0087618 | A1 | * | 3/2016 | Niitsuma | H03K 5/135 365/233.11 |

FOREIGN PATENT DOCUMENTS

JP        2009-117020 A    5/2009

* cited by examiner

*Primary Examiner* — Lincoln Donovan
*Assistant Examiner* — Thomas Skibinski
(74) *Attorney, Agent, or Firm* — Canon USA, Inc., IP Division

(57) ABSTRACT

A semiconductor integrated circuit includes a first generation unit configured to generate a fixed frequency division clock signal (first signal) from an output clock signal of a clock source, a fixed frequency division state monitoring unit configured to monitor the first signal, a second generation unit configured to generate a variable frequency division clock signal (second signal) from the output signal, and a variable frequency division state monitoring unit configured to monitor the second signal. In a case where the frequency of the second signal is returned from a reduced frequency to normal, when the variable frequency division state monitoring unit determines that the second signal becomes high in a next cycle, output of the second signal is stopped, and when the fixed frequency division state monitoring unit determines, after the output is stopped, that the first signal becomes high in a next cycle, the output is resumed.

4 Claims, 9 Drawing Sheets

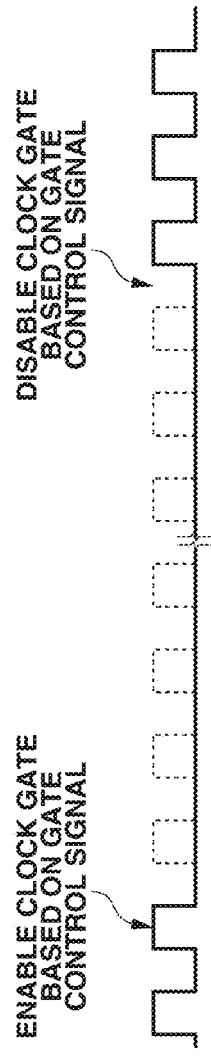
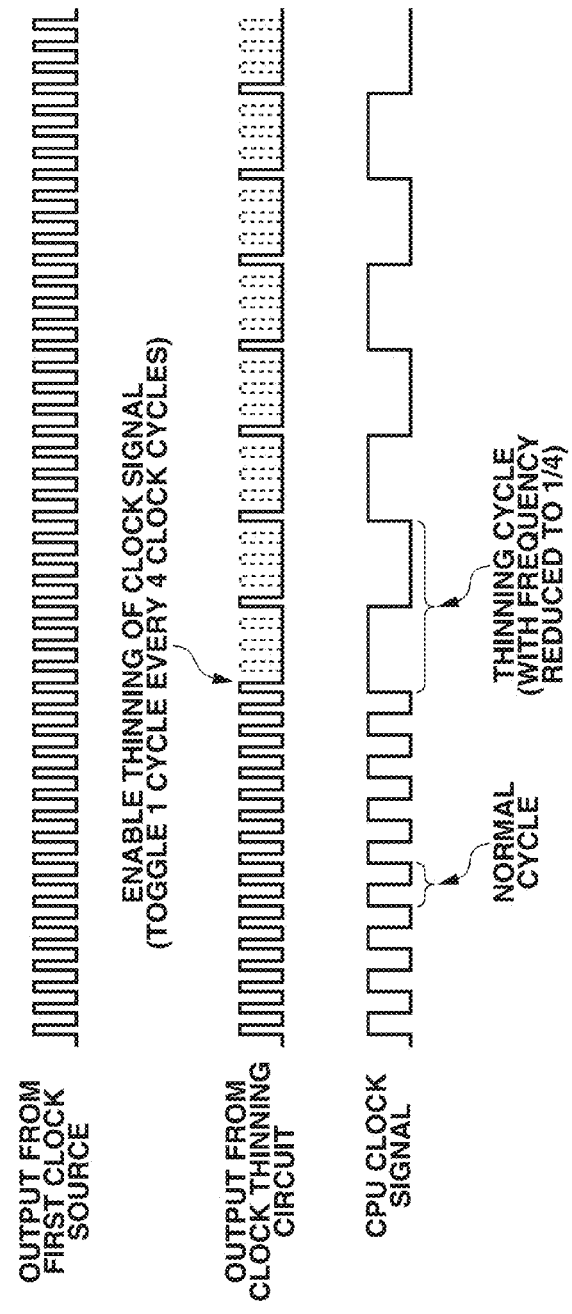

SEMICONDUCTOR INTEGRATED CIRCUIT, APPARATUS INCLUDING SEMICONDUCTOR INTEGRATED CIRCUIT, AND METHOD FOR CONTROLLING CLOCK SIGNAL IN SEMICONDUCTOR INTEGRATED CIRCUIT

BACKGROUND OF THE INVENTION

1. Field of the Invention

The present invention relates to a technique for performing phase adjustment among clock signals in a semiconductor integrated circuit.

2. Description of the Related Art

A semiconductor integrated circuit is used in an information processing apparatus such as a personal computer (PC), and an image forming apparatus such as a multifunction peripheral (MFP). In general, the semiconductor integrated circuit used in these apparatuses includes therein a bus structure for data transfer between a central processing unit (CPU) and various peripheral functional circuits. Such a bus in the semiconductor integrated circuit has a configuration where a flip-flop (FF) synchronous circuit that operates in synchronization with a clock signal is used to receive and transmit data, so that the semiconductor integrated circuit performs data transfer using the synchronous bus. In synchronous circuit design, the circuit design is performed assuming a configuration in which the edges of clock signals are coincident with each other, so that the timing design for guaranteeing the circuit operation by verifying the setup time and the hold time of an FF is performed. In addition, in a semiconductor integrated circuit that uses a plurality of clock signals, the normal operations of synchronous circuits can be guaranteed by satisfying the timing design in the cycle of a faster clock signal if clock signals that operate FFs has a relationship in which the ratio of the frequency of a clock signal and the frequency of another clock signal can be expressed as the ratio of natural numbers and their edge positions are coincident with each other. Conversely, in the case of data transfer between clock signals having the same frequency but the phases shifted from each other, it is more difficult to secure the setup time and the hold time of an FF that receives data. Accordingly, for the synchronization circuits, it is important that the phases of clock signals are coincident with each other.

For example, Japanese Patent Application Laid-Open No. 2009-117020 discloses a technique in which, by detecting the phases of two types of clock signals having the same frequency but the phases shifted from each other by a half cycle, and inserting a delay into either of the clock signals to adjust the phases, the phases of the two types of clock signals are made coincident with each other.

The technique disclosed in Japanese Patent Application Laid-Open No. 2009-117020 is limited to a configuration that adjusts the phases of two types of clock signals having the same frequency but the phases shifted from each other by a half cycle. Some semiconductor integrated circuits used in various devices may use more types of clock signals. In this case, it is necessary to adjust the phases of two or more types of clock signals having different frequencies so that the phases can be synchronized with one another.

In a case where, to synchronize the phases of two or more types of clock signals with one another, the phases need to be adjusted so that the edges of the clock signals are coincident with one another as described above, by performing the phase adjustment relative to the lowest-frequency clock signal, the edges of the clock signals having the other frequencies can also be made coincident. However, in the case of implementing the above phase adjustment by inserting a delay into a clock signal, the delay needs to be inserted into the clock signal having the lowest frequency, i.e., the longest cycle, resulting in a longer time taken to perform the adjustment.

SUMMARY OF THE INVENTION

According to an aspect of the present invention, a semiconductor integrated circuit includes a first generation unit configured to generate, in response to an output clock signal of a clock source, a fixed frequency division clock signal having a fixed frequency, a fixed frequency division state monitoring unit configured to monitor a frequency division state of the fixed frequency division clock signal, a second generation unit configured to generate, in response to the output clock signal of the clock source, a variable frequency division clock signal having a variable frequency, and a variable frequency division state monitoring unit configured to monitor a frequency division state of the variable frequency division clock signal. In a case where the frequency of the variable frequency division clock signal is returned from a frequency obtained by reducing a normal frequency to the normal frequency, when the variable frequency division state monitoring unit determines that the variable frequency division clock signal becomes a high state in a next cycle, output of the variable frequency division clock signal having the frequency returned to the normal frequency is stopped, and when the fixed frequency division state monitoring unit determines, after the output is stopped, that the fixed frequency division clock signal becomes a high state in a next cycle, the output of the variable frequency division clock signal having the frequency returned to the normal frequency is resumed.

Further features of the present invention will become apparent from the following description of exemplary embodiments with reference to the attached drawings.

BRIEF DESCRIPTION OF THE DRAWINGS

FIG. 4A illustrates a state where oscillation of a clock signal is stopped by a clock gate circuit, and FIG. 4B illustrates a state where a clock signal is thinned by a clock thinning circuit.

DESCRIPTION OF THE EMBODIMENTS

An exemplary embodiment of the present invention will be described in detail below with reference to the attached drawings. Configurations illustrated in the following exemplary embodiment are merely examples, and the present invention is not limited to the illustrated configurations.

Figure 1:
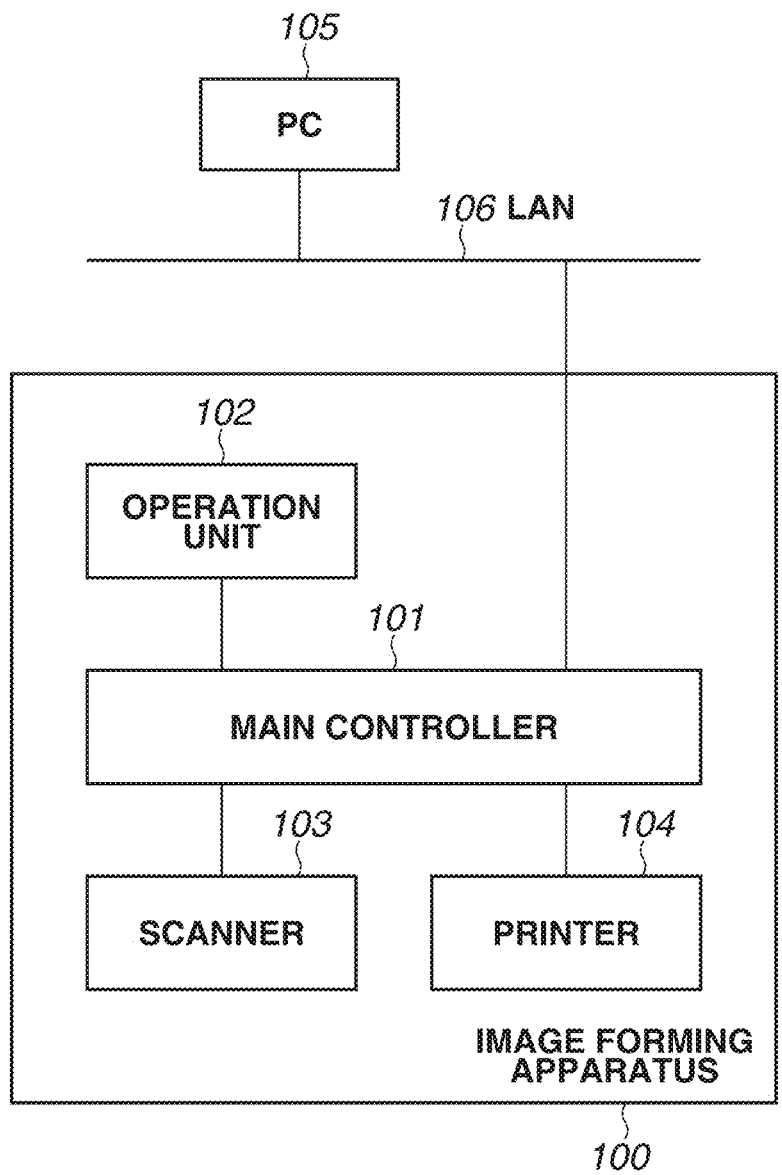
FIG. 1 is a block diagram illustrating a system configuration of an image forming apparatus as an example of an apparatus including a semiconductor integrated circuit.

FIG. 1 is a block diagram illustrating a system configuration of an image forming apparatus 100 as an example of an apparatus including a semiconductor integrated circuit according to an exemplary embodiment of the present invention. The image forming apparatus 100 is a multifunctional peripheral that solely implements a plurality of functions such as a copying, printing, and faxing. The image forming apparatus 100 includes a main controller 101, an operation unit 102 serving as a user interface, a scanner 103 serving as an image input device, and a printer 104 serving as an image output device.

Each of the operation unit 102, the scanner 103, and the printer 104 is connected to the main controller 101, and is controlled according to an instruction from the main controller 101. The main controller 101 is connected to a local area network (LAN) 106, and is connected to a PC 105 via the LAN 106.

The PC 105 is a general computer, and transmits, to the image forming apparatus 100 via the LAN 106, an instruction (print job) for printing document data or the like created by an application that operates on the PC 105.

<Configuration of Main Controller>

Next, the main controller 101 of the image forming apparatus 100 will be described in detail.

Figure 2:
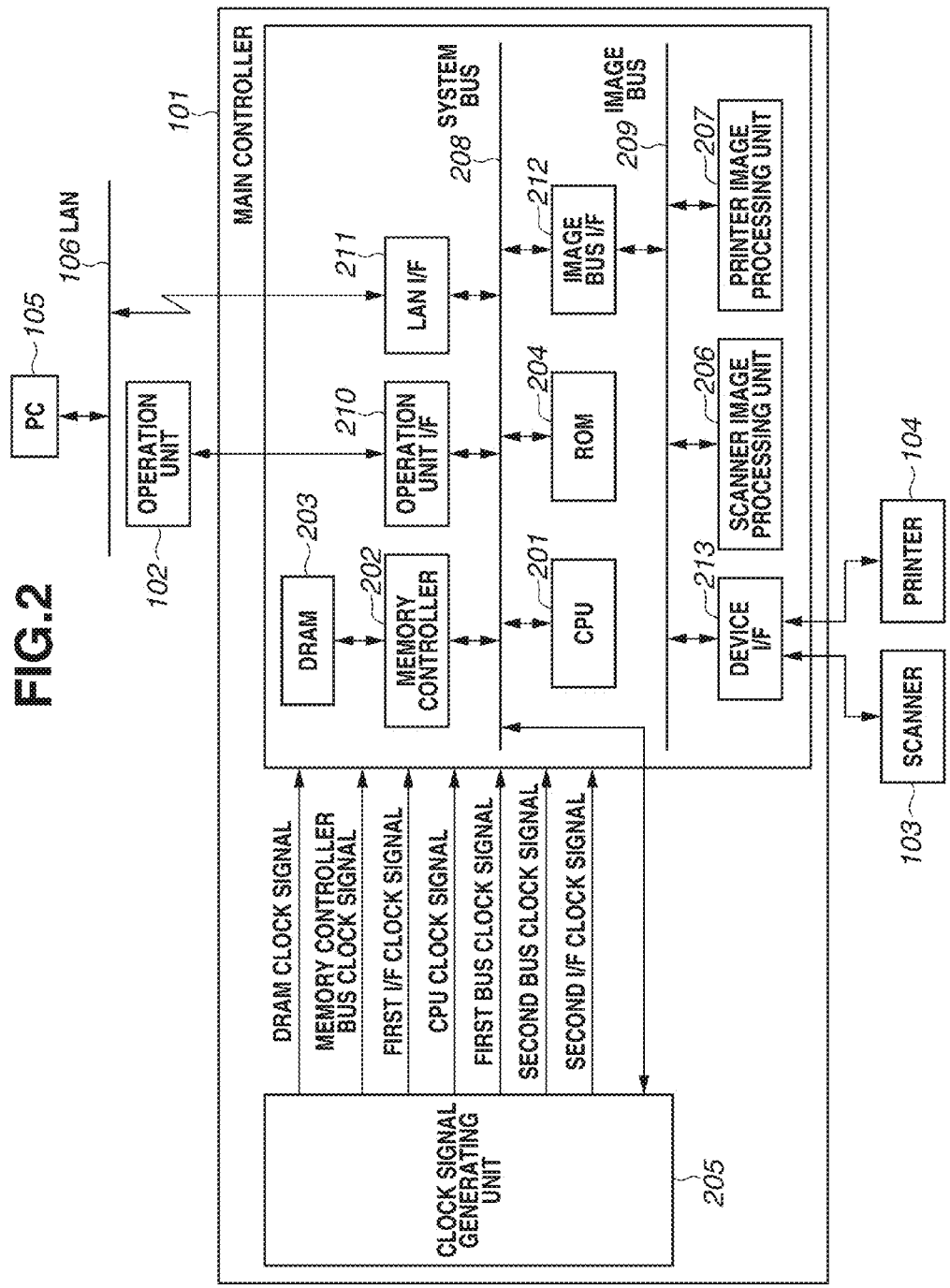
FIG. 2 is a block diagram illustrating an internal configuration of a main controller of the image forming apparatus.

FIG. 2 is a block diagram illustrating an internal configuration of the main controller 101. The main controller 101 controls the entire image forming apparatus 100. The main controller 101 controls the scanner 103 and the printer 104, and also inputs/outputs image data, device information, etc. from/to the PC 105 via the LAN 106.

The main controller 101 includes a CPU 201, a memory controller 202, a dynamic random access memory (DRAM) 203, a read-only memory (ROM) 204, a clock signal generating unit 205, a scanner image processing unit 206, a printer image processing unit 207, a system bus 208, and an image bus 209. The main controller 101 further includes, as various interfaces, an operation unit interface (I/F) 210, a LAN I/F 211, an image bus I/F 212, and a device I/F 213.

The CPU 201 is connected to the ROM 204, the image bus I/F 212, the memory controller 202, the operation unit I/F 210, the LAN I/F 211, and the clock signal generating unit 205 via the system bus 208. The ROM 204 stores a system boot program, predetermined execution programs, etc. The DRAM 203 is a storage area from/to which data can be read/written as needed to provide an operation area as a work area for the CPU 201. The DRAM 203 is used to temporarily store setting values of the image forming apparatus 100 and information of jobs to be executed by the image forming apparatus 100, and also used as an image memory for temporarily storing image data. The memory controller 202 controls the DRAM 203, and reads/writes data from/to the DRAM 203.

The operation unit I/F 210 is an interface for input/output from/to the operation unit 102. The operation unit I/F 210 is used to output image data to be displayed to the operation unit 102, and transfer information input by a user via the operation unit 102 to the CPU 201. The LAN I/F 211 is an interface for connecting to the LAN 106, and inputs/outputs information from/to the LAN 106. The image bus I/F 212 is an interface for connecting the system bus 208 and the image bus 209, which transfers image data at high speed, to each other, and operates as a bus bridge that converts a data structure. The device I/F 213, the scanner image processing unit 206, the printer image processing unit 207 are connected to the image bus 209. The device I/F 213 is an interface for connecting the scanner 103 and the printer 104 to the main controller 101, and converts an image data format.

The clock signal generating unit 205 includes an oscillation circuit such as a crystal oscillator or a phase-locked loop (PLL) circuit, and a frequency divider that divides the frequency of an output clock signal of the oscillation circuit. The clock signal generating unit 205 generates and outputs various clock signals for operating synchronous circuits. The clock signal generating unit 205 supplies various clock signals to functional modules in the main controller 101, such as the CPU 201, the ROM 204, the memory controller 202, the DRAM 203, the system bus 208, the image bus 209, the scanner image processing unit 206, the printer image processing unit 207, and the various I/Fs. The configuration of the clock signal generating unit 205, and the clock signals to be output therefrom will be described in detail below. Each of the functional modules in the main controller 101 is formed of a semiconductor integrated circuit using, for example, a complementary metal-oxide (CMOS) semiconductor.

The scanner image processing unit 206 performs image processing, such as correction, processing, and editing, on input image data read from the scanner 103. The printer image processing unit 207 performs image processing, such as color conversion, filtering, and resolution conversion, on print image data to be output to the printer 104.

<Clock Signal Generating Unit>

Figure 3:
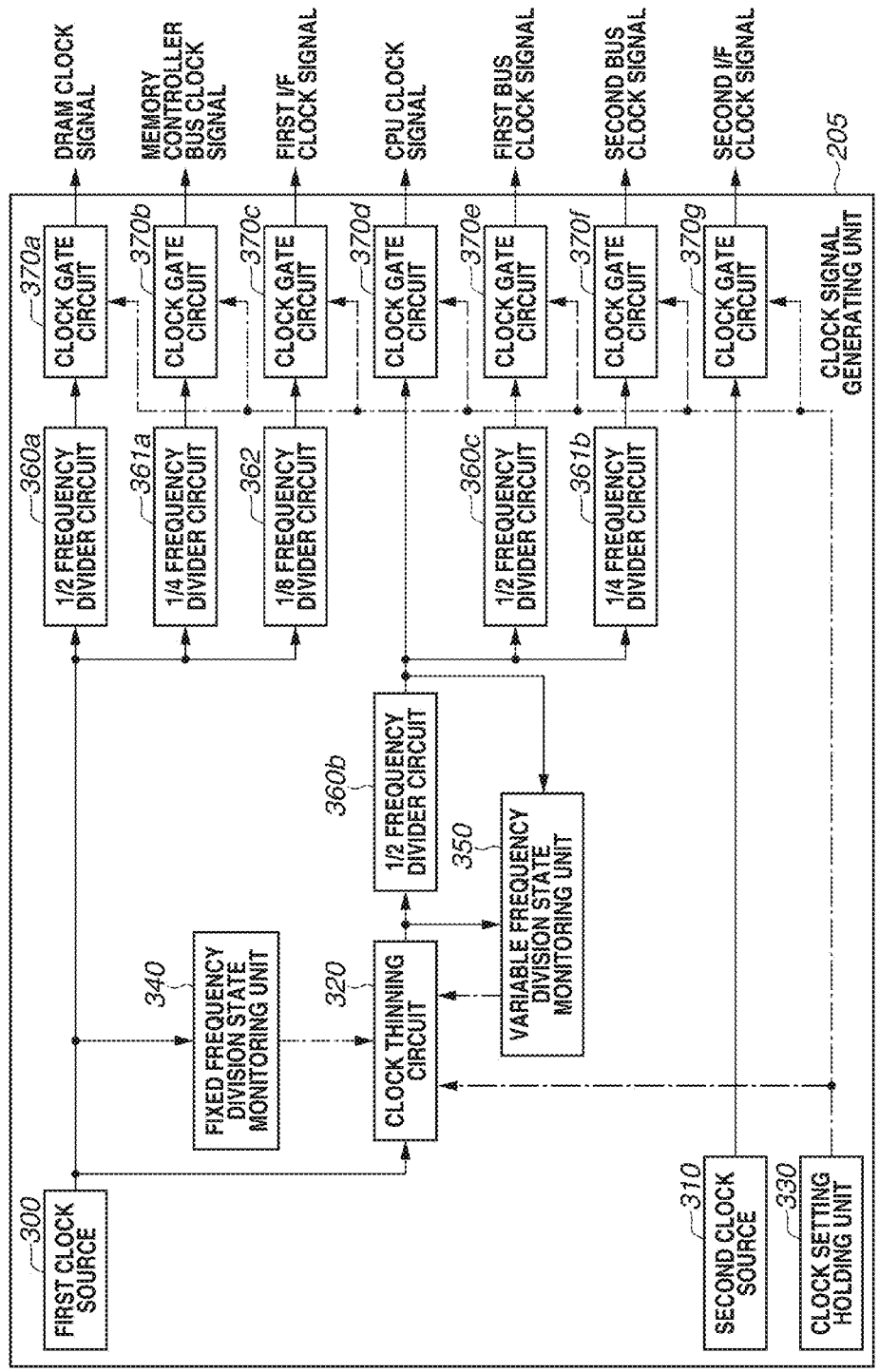
FIG. 3 is a block diagram illustrating an internal configuration of a clock signal generating unit.

FIG. 3 is a block diagram illustrating an internal configuration of the clock signal generating unit 205 according to the present exemplary embodiment. The clock signal generating unit 205 includes a first clock source 300, a second clock source 310, a clock thinning circuit 320, a clock setting holding unit 330, a fixed frequency division state monitoring unit 340, and a variable frequency division state monitoring unit 350. The clock signal generating unit 205 further includes a plurality of frequency divider circuits, namely, ½ frequency divider circuits 360a, 360b, and 360c, ¼ frequency divider circuits 361a and 361b, a ⅛ frequency divider circuit 362, and a plurality of clock gate circuits, namely, clock gate circuits 370a, 370b, 370c, 370d, 370e, 370e, 370f, and 370g.

The first clock source 300 and the second clock source 310 are oscillation circuits, such as a crystal oscillator or a PLL circuit, each of which generates and outputs a clock signal which oscillates with its own phase and frequency.

Each of the ½ frequency divider circuits 360a to 306c, the ¼ frequency divider circuits 361a and 361b, and the ⅛ frequency divider circuit 362 is a frequency divider circuit that inputs an output clock signal of the clock source or the frequency divider circuit, which is located in the previous stage thereof, and newly generates a frequency division clock signal from the input clock signal. In other words, the ½ frequency divider circuits 360a to 360c each generate a frequency division clock signal having a frequency that is half of the frequency of the input clock signal. The ¼ frequency divider circuits 361a and 361b each generate a frequency division clock signal having a frequency that is one-fourth of the frequency of the input clock signal. The ⅛ frequency divider circuit 362 generates a frequency division clock signal having a frequency that is one-eighth of the frequency of the input clock signal. Although the present exemplary embodiment uses frequency divider circuits having the frequency division numbers 2, 4, and 8 as examples of frequency divider circuits, the frequency division number is not limited thereto. For example, the clock signal generating unit 205 may include a frequency divider circuit having the frequency division number 3 or 16, depending on the frequency of a clock signal required by a functional module in the main controller 101.

Based on a gate control signal from the clock setting holding unit 330 (described below), each of the clock gate circuits 370a to 370g controls the toggling of a clock signal. More specifically, when a clock gate function is enabled based on the gate control signal, an output clock signal is fixed to a low level to stop supply (oscillation) of the output clock signal. FIG. 4A illustrates a state where oscillation of a clock signal is stopped by a clock gate circuit. In FIG. 4A, waveforms indicated by broken lines indicate a normal clock signal that would be toggled if the clock gate function were not enabled (if the gate function were disabled). The clock signal generating unit 205 supplies, via the clock gate circuits 370a to 370g, a DRAM clock signal, a memory controller bus clock signal, a first I/F clock signal, a CPU clock signal, a first bus clock signal, a second bus clock signal, and a second I/F clock signal to the synchronous circuits of the corresponding functional modules in the main controller 101. Correspondences between the clock signals and the functional modules are as follows.

The DRAM clock signal: the DRAM 203
The memory controller bus clock signal: the memory controller 202
The first I/F clock signal: the LAN I/F 211
The CPU clock signal: the CPU 201
The first bus clock signal: the ROM 204, the system bus 208
The second bus clock signal: the scanner image processing unit 206, the printer image processing unit 207, the image bus 209, the image bus I/F 212, the device I/F 213
The second I/F clock signal: the operation unit I/F 210

Each of the above-described clock signals can be controlled by the gate of the corresponding one of the clock gate circuits 370a to 370g. By separately stopping supply of a clock signal to the synchronous circuit of a functional module that does not need to operate, the power consumption of the image forming apparatus 100 can be reduced.

Based on a thinning control signal from the clock setting holding unit 330 (described below), the clock thinning circuit 320 outputs a clock signal (thinned clock signal) obtained by thinning an output clock signal of the first clock source 300 by using a clock gate circuit therein. FIG. 4B illustrates a state where the clock thinning circuit 320 thins a clock signal output from the first clock source 300. More specifically, FIG. 4B illustrates that when the thinning of a clock signal is enabled based on a thinning control signal, the clock signal is output in such a way that three cycles are removed from consecutive four clock cycles and one cycle is periodically toggled. At this time, the CPU clock signal is obtained by dividing the frequency of the output clock signal of the clock thinning circuit 320 by 2 using the ½ frequency divider circuit 360b. Thus, the CPU clock signal has a frequency (with a period 4 times the normal period) reduced to one-fourth of the normal frequency. The present exemplary embodiment has described, as an example of the clock thinning circuit 320, an example in which three cycles are removed from four consecutive clock cycles and one cycle is periodically toggled. However, the way of thinning a clock signal is not limited thereto. For example, according to the frequency of a clock signal necessary for reducing the power consumption of the image forming apparatus 100, the clock thinning circuit 320 may be configured to remove six cycles from seven clock cycles. By supplying a clock signal having such a reduced frequency to the synchronous circuit of a functional module that is allowed to slowly operate, the power consumption of the image forming apparatus 100 can be reduced while the synchronization circuit is maintained to operate. The clock thinning circuit 320 performs control to thin an output clock signal, and performs control such as stopping and resuming output of a clock signal, based on fixed frequency division state information from the fixed frequency division state monitoring unit 340 (described below), and variable frequency division state information from the variable frequency division state monitoring unit 350 (described below).

The clock setting holding unit 330 holds the contents of setting instructions for controlling the clock thinning circuit 320 and the clock gate circuits 370a to 370g, and outputs the corresponding clock control signals (thinning control signal and gate control signal) thereto. The clock signal control settings held by the clock setting holding unit 330 are performed by the CPU 201 via the system bus 208.

The fixed frequency division state monitoring unit 340 monitors the frequency division states of the ½ frequency divider circuit 360a, the ¼ frequency divider circuit 361a, and the ⅛ frequency divider circuit 362 that generate fixed frequency division clock signals, more specifically, the DRAM clock signal, the memory controller bus clock signal, and the first I/F clock signal, respectively. The fixed frequency division state monitoring unit 340 outputs, to the clock thinning circuit 320, the fixed frequency division state information which represents High/Low information of the waveform of each of the DRAM clock signal, the memory controller bus clock signal, the first I/F clock signal.

The variable frequency division state monitoring unit 350 monitors the frequency division state of the ½ frequency divider circuit 360b, which divides the frequency of the output clock signal of the clock thinning circuit 320 by 2 to generate the CPU clock signal, the frequency division state of the ½ frequency divider circuit 360c, which divides the output clock signal of the ½ frequency divider circuit 360b by 2 to generate the first bus clock signal, and the frequency division state of the ¼ frequency divider circuit 361b which divides the clock signal of the ½ frequency divider circuit 360b by 4 to generate the second bus clock signal. The variable frequency division state monitoring unit 350 outputs, to the clock thinning circuit 320, the variable frequency division state information which represents High/Low information of the waveform of each of the CPU clock signal, the first bus clock signal, the second bus clock signal.

<Shift from Normal Clock Signal Output State to Thinned Clock Signal Output State>

Figure 5:
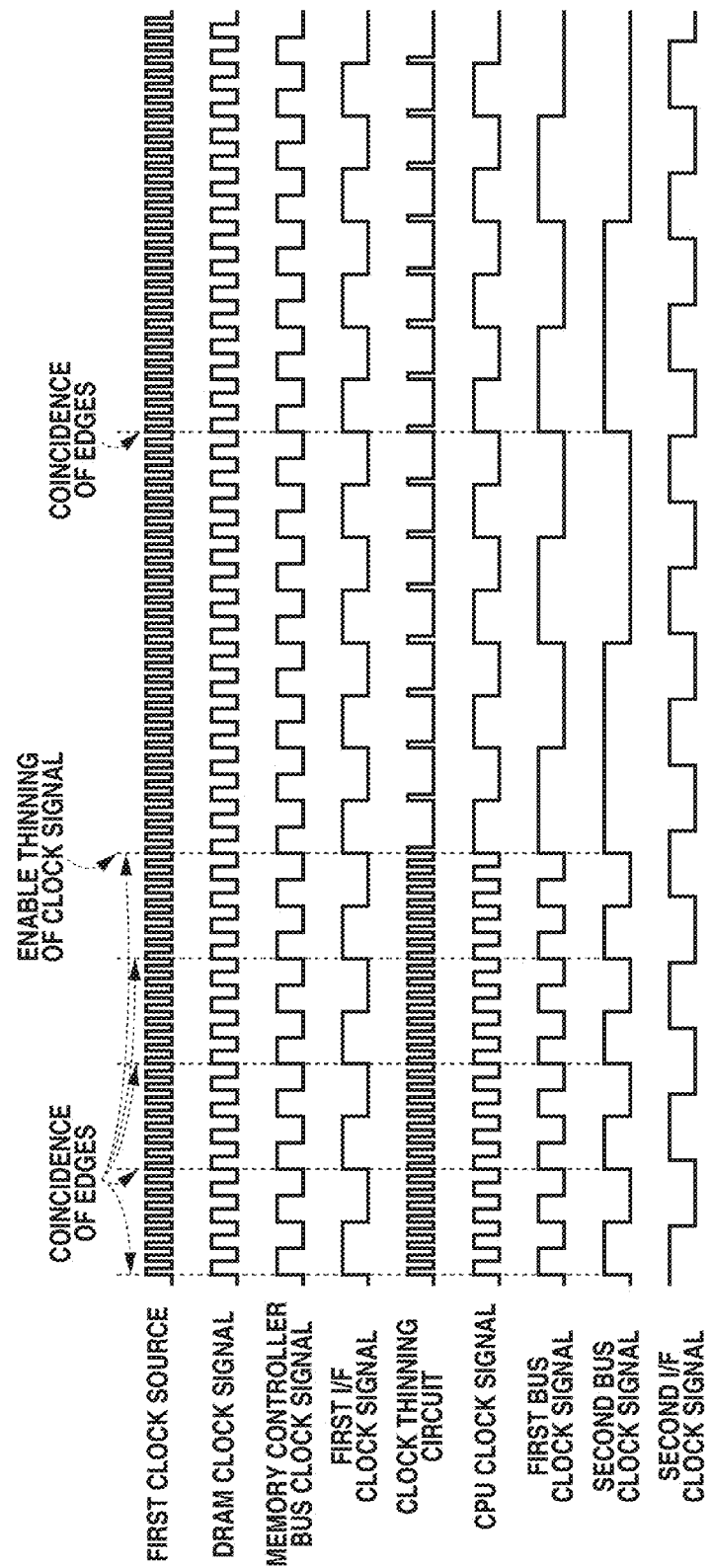
FIG. 5 illustrates a process of shifting from a state where the clock thinning circuit outputs a normal clock signal to a state where the clock thinning circuit outputs a thinned clock signal.

FIG. 5 illustrates a process of shifting from a state where the clock thinning circuit 320 outputs a normal clock signal to a state where the clock thinning circuit 320 outputs a thinned clock signal. In the present exemplary embodiment, the DRAM clock signal, the memory controller bus clock signal, the first I/F clock signal, the CPU clock signal, the first bus clock signal, and the second bus clock signal are generated based on the output clock signal of the first clock source 300, which is a common clock signal source. Accordingly, these clock signals can configure a synchronous relationship in which their rising edges are coincident with one another at each of timings indicated by broken lines illustrated in FIG. 5. Therefore, for synchronization circuits that operate using the above-described clock signals, by designing timings among clock signals with which data transfer occurs, the normal data transfer operations of the synchronization circuits can be guaranteed. On the other hand, the second I/F clock signal, which is generated based on the output clock signal of the second clock source 310 independent of the first clock source 300, and the above-described clock signal group have an asynchronous relationship in which they differ in phase and frequency from each other. Thus, for data transfer to the synchronous circuit which operates using the second I/F clock signal, a data synchronization circuit is necessary.

Among the clock signals output by the clock signal generating unit 205, the DRAM clock signal, the memory controller bus clock signal, and the first I/F clock signal are fixed frequency clock signals irrespective of the clock signal output by the clock thinning circuit 320. These clock signals are used in a case where the frequency is not allowed to dynamically change or in a case where the frequency needs to be a predetermined frequency. The CPU clock signal, the first bus clock signal, and the second bus clock signal are frequency division clock signals generated by dividing the frequency of the clock signal output by the clock thinning circuit 320, and are clock signals having variable frequencies according to the clock signal thinning setting. When the clock signal thinning setting is enabled at the timing of "ENABLE THINNING OF CLOCK SIGNAL" illustrated in FIG. 5, the frequency of the clock signal output by the clock thinning circuit 320 is reduced. When the clock thinning circuit 320 shifts to the output of a frequency obtained by reducing the normal frequency as described above, the frequency ratio between the clock signals also changes. For example, the frequency ratio between the memory controller bus clock signal and the first bus clock signal is changed from 1:1 to 4:1. The frequency ratio is not constant, but changes based on the thinning setting.

<Shift from Thinned Clock Signal Output State to Normal Clock Signal Output State>

Figure 6:
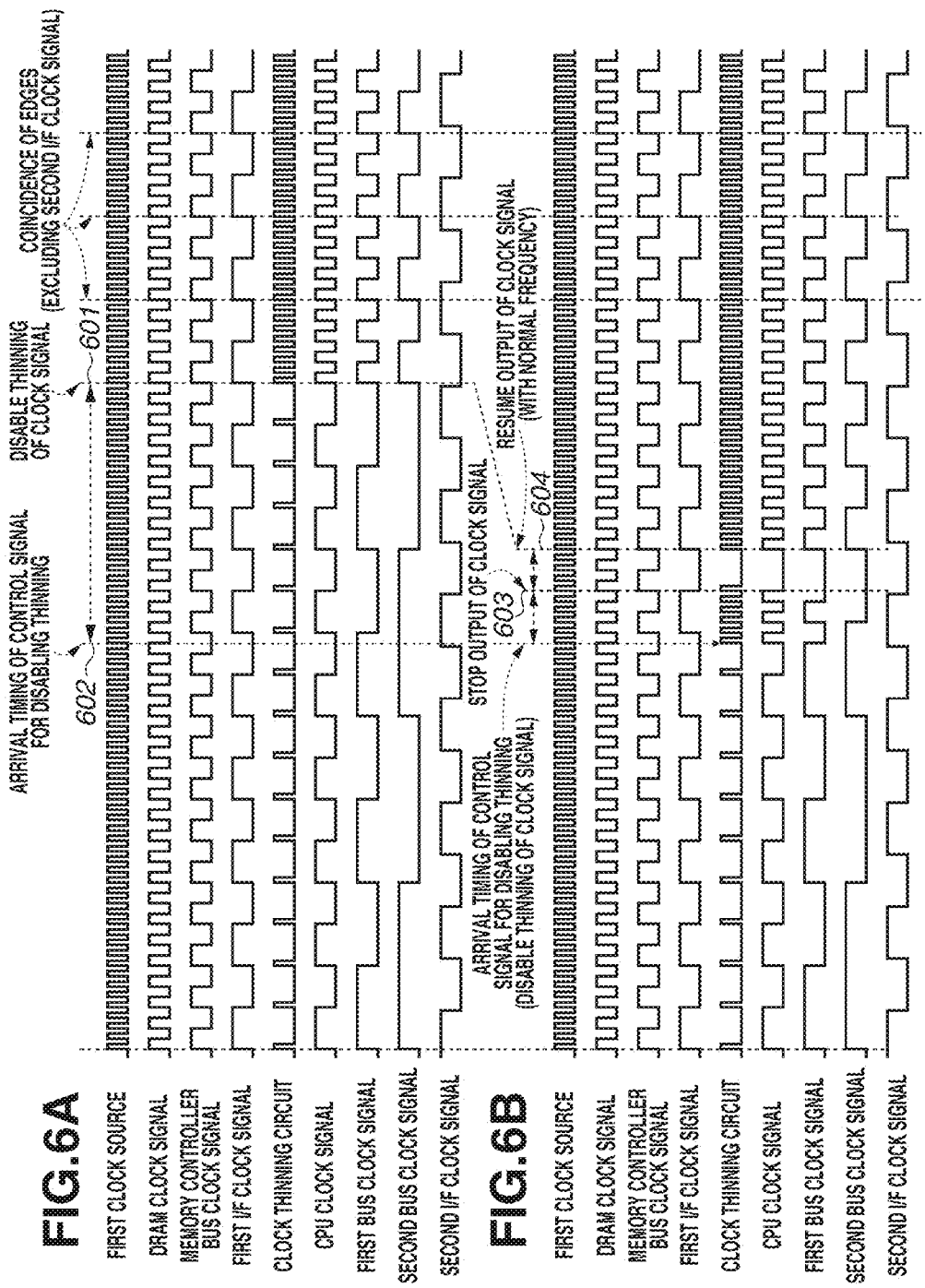
FIGS. 6A and 6B each illustrate a process of shifting from the state where the clock thinning circuit outputs a thinned clock signal to the state where the clock thinning circuit outputs a normal clock signal.

FIGS. 6A and 6B illustrate a process of shifting from a state where the clock thinning circuit 320 outputs a thinned clock signal to a state where the clock thinning circuit 320 outputs a normal clock signal. As illustrated in FIG. 6A, among the three variable frequency division clock signals (the CPU clock signal, the first bus clock signal, and the second bus clock signal) that are in a synchronous relationship, the second bus clock signal has the lowest frequency, and has rising edges that are coincident in position with those of the CPU clock signal and the first bus clock signal. Similarly, among the three fixed frequency division clock signals (the DRAM clock signal, the memory controller bus clock signal, and the first I/F clock signal) that are in a synchronous relationship, the first I/F clock signal has the lowest frequency, and has rising edges that are coincident in position with those of the DRAM clock signal and the memory controller bus clock signal. In other words, in a case where the second bus clock signal and the first I/F clock signal are coincident in rising edge timing with each other, the frequency division clock signal group having variable frequencies, and the frequency division clock signal group having fixed frequencies are coincident in rising edge timing with each other.

Based on the above, by returning the frequency of the output clock signal to the normal frequency so that the rising edge of the second bus clock signal is coincident with the rising edge of the first I/F clock signal at a timing 601, the phases of the (group of) clock signals having fixed frequencies and the phases of the (group of) clock signals having variable frequencies can match each other. At this time, the timing at which the clock control setting performed by the CPU 201 is held by the clock setting holding unit 330 is not uniquely determined. Accordingly, the timing at which the clock thinning circuit 320 receives the thinning control signal from the clock setting holding unit 330 is not uniquely determined, either. Therefore, the clock thinning circuit 320 requires, as a phase adjustment period, a period such as a period from a timing 602 to a timing 601 in order to return the frequency to normal by disabling the clock thinning setting after receiving the thinning control signal (see FIG. 6A).

To shorten the phase adjustment period, the present exemplary embodiment has employed a configuration to be described below. This configuration will be described in detail with reference to FIG. 6B.

Immediately after receiving the thinning control signal at the timing 602, the clock thinning circuit 320 disables the clock thinning setting to return the frequency of its output clock signal to normal. Then, the clock thinning circuit 320 temporarily stops output of the clock signal at the timing 603, and resumes the output of the clock signal (having the normal frequency) at the timing 604. The timing at which the clock thinning circuit 320 stops and resumes the output of the clock signal is determined based on the high/low state of each clock signal according to the above-described fixed frequency division state information that is output by the fixed frequency division state monitoring unit 340 and the above-described variable frequency division state information that is output by the variable frequency division state monitoring unit 350. The timing 604 is the timing at which a rising edge of the first I/F clock signal, which has the lowest frequency among the frequency division clock signals having fixed frequencies, is located. At the timing 604, a rising edge of the second bus clock signal, which has the lowest frequency among the frequency division clock signals having variable frequencies, is coincident in position with the rising edge of the first I/F clock signal. In other words, compared with the required phase adjustment period (the period from the timing 602 to the timing 601) illustrated in FIG. 6A, the present exemplary embodiment only requires the period from the timing 602 to the timing 604. This can significantly shorten the period to adjust the phases between the fixed frequency division clock signals and the variable frequency division clock signals.

<Power-Saving Control by Image Forming Apparatus>

Next, power-saving control by the main controller 101 of the image forming apparatus 100 will be described. The image forming apparatus 100 uses two types of operation modes (normal mode and power-saving mode) that have different power consumptions according to the operating state of the image forming apparatus 100. In a case where the operation unit 102 has not received an operation from a user for a predetermined period, or a print job has not been executed for a predetermined period, the image forming apparatus 100 shifts from the normal mode, which is a normal operation state, to the power-saving mode, which is a standby state with a reduced power consumption. Accordingly, in the power-saving mode, the image forming apparatus 100 does not execute a print job or the like, and some functional modules on the main controller 101 are in a state where they do not need to operate, or a state where they work without any trouble even if their operation speeds are reduced. In other words, in the power-saving mode, the image forming apparatus 100 is in a state where the clock signal generating unit 205 can stop supply of clock signals to some functional modules on the main controller 101 or can reduce the frequencies of the clock signals.

Figure 7:
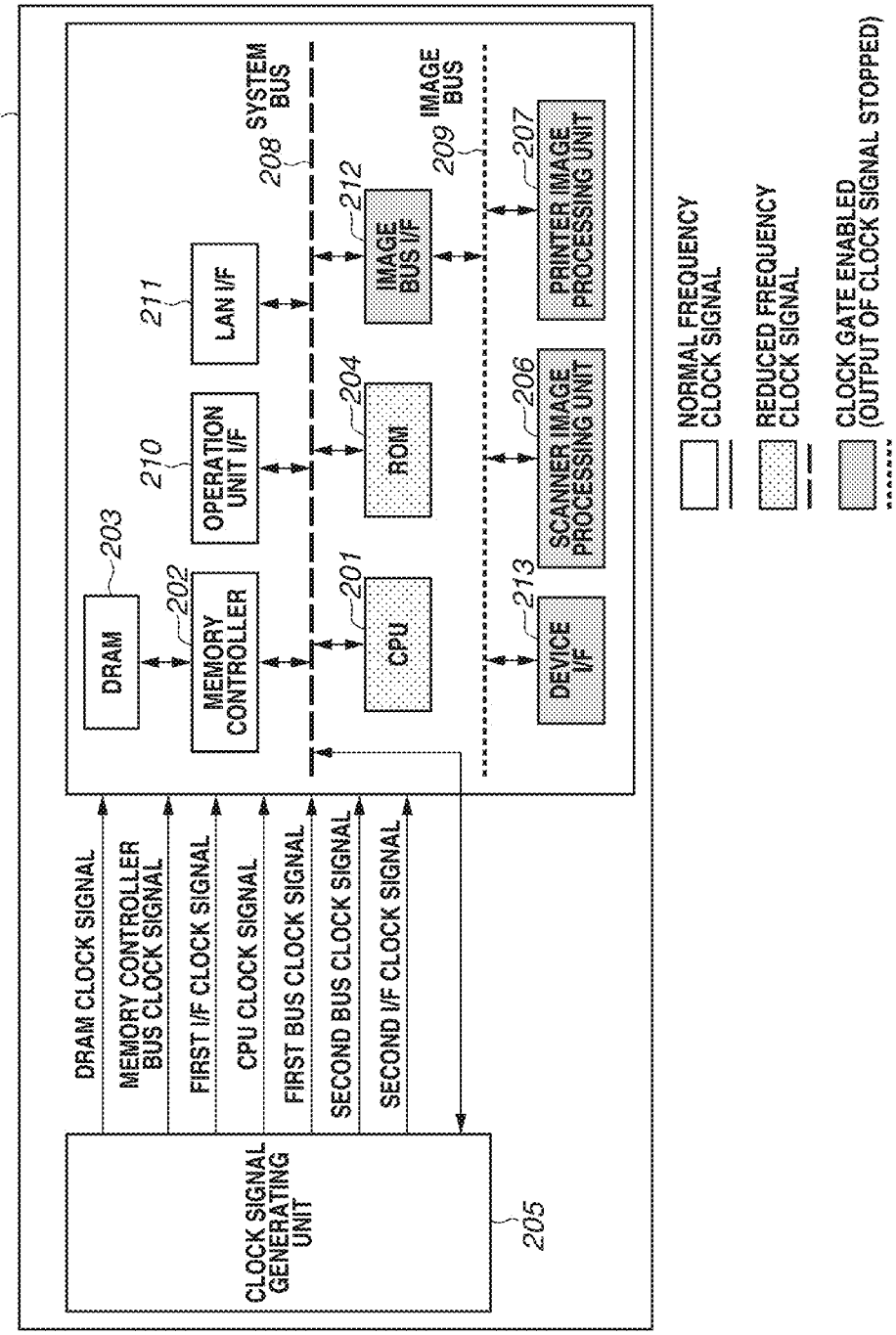
FIG. 7 is a block diagram illustrating a clock supply state of each functional module of the main controller in a power-saving mode.

FIG. 7 illustrates a clock signal supply state of each of the functional modules of the main controller 101 in the power-saving mode. In FIG. 7, the functional modules that operate using normal clock signals (i.e., clock signals whose frequencies are not reduced) output by the clock signal generating unit 205, are the DRAM 203, the memory controller 202, the operation unit I/F 210, and the LAN I/F 211. The functional modules that operate using thinned clock signals (i.e., clock signals having reduced frequencies) output by the clock signal generating unit 205, are the CPU 201, the ROM 204, and the system bus 208. The functional modules that stop operation by being not supplied with a clock signal from the clock signal generating unit 205 under gate control of a clock gate circuit are the image bus I/F 212, the device I/F 213, the scanner image processing unit 206, the printer image processing unit 207, and the image bus 209.

In the power-saving mode, by reducing the frequency of a clock signal or stopping the supply of a clock signal as described above, the power consumption can be made lower than that in the normal mode. When the user performs a return instruction operation via the operation unit 102, or a print job is received from the PC 105 via the LAN 106, the supply of the clock signal, which has been stopped, is resumed or the reduced frequency of the clock signal is returned to normal. This allows the image forming apparatus 100 to return from the power-saving mode to the normal mode, so that the image forming apparatus 100 becomes ready to execute processing such as a print job.

<Clock Control>

Figure 8:
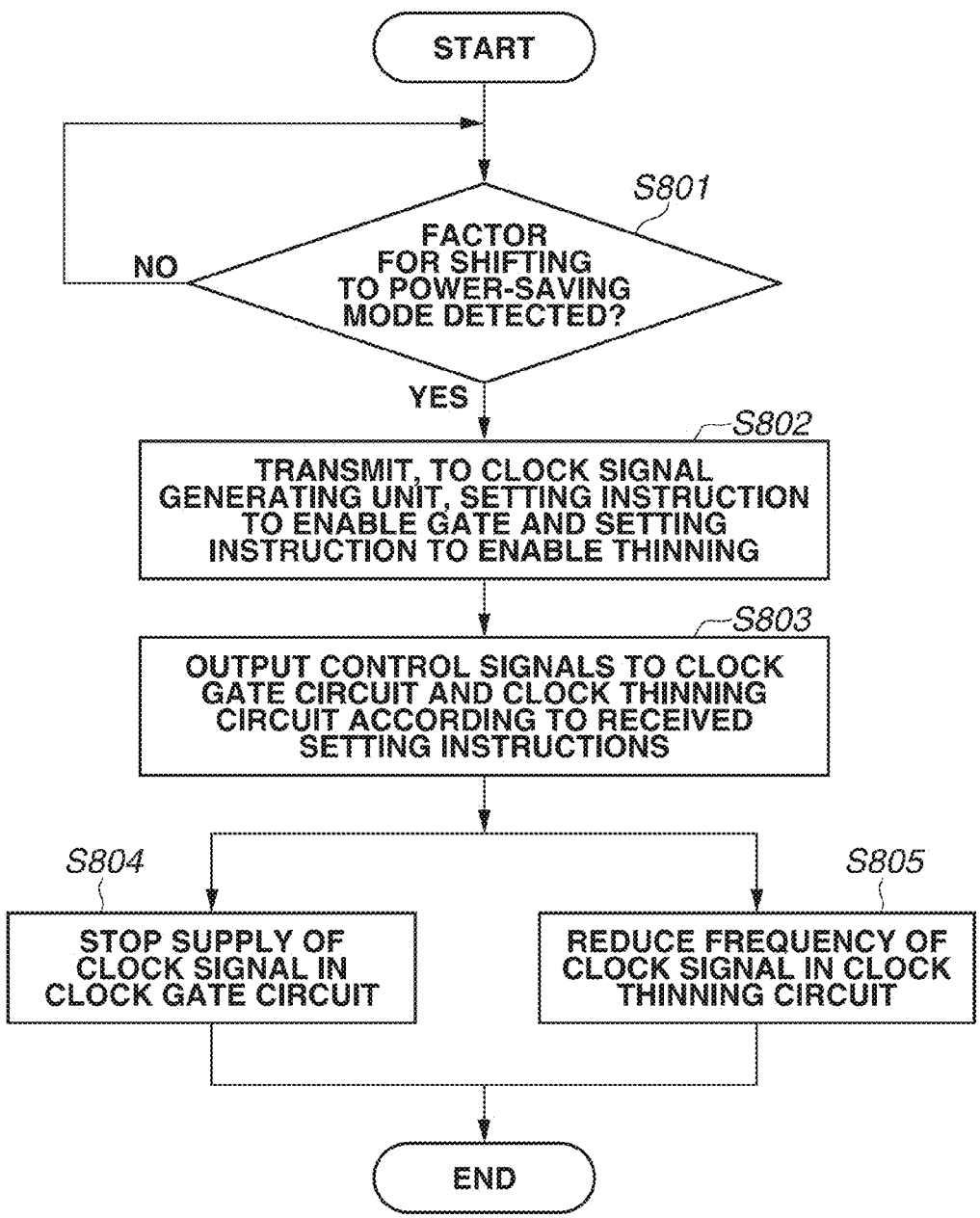
FIG. 8 is a flowchart illustrating a flow of control that is performed when the image forming apparatus is to shift from a normal mode to the power-saving mode.

Next, clock signal control by the main controller 101 will be described in detail with reference to the flowchart illustrated in FIG. 8.

First, the control performed when the image forming apparatus 100 is to shift from the normal mode to the power-saving mode will be described with reference to FIG. 8.

In step S801, the CPU 201 in the main controller 101 determines whether a factor for shifting from the normal mode to the power-saving mode has been detected. Examples of the factor include an event in which a predetermined time (e.g., 15 minutes) has elapsed without execution of a print job. If the CPU 201 determines that the factor has been detected (YES in step S801), the processing proceeds to step S802. If the CPU 201 determines that the factor has not been detected (NO in step S801), the CPU 201 continues the monitoring.

In step S802, the CPU 201 transmits, to the clock signal generating unit 205 via the system bus 208, a setting instruction to enable a gate for a particular clock signal and a setting instruction to enable the thinning of a particular clock signal.

In step S803, the clock setting holding unit 330 in the clock signal generating unit 205 holds the contents of both the received two types of setting instructions, and outputs predetermined control signals. More specifically, the clock setting holding unit 330 outputs, to a corresponding clock gate circuit, a gate control signal for enabling its gate, and outputs, to the clock thinning circuit 320, a thinning control signal for enabling the thinning. In this case, details of control signals for realizing the above-described state illustrated in FIG. 7 are described in the following table.

TABLE 1

| Detail of Clock Signal | Control Signal |
| --- | --- |
| Supply a thinned clock signal to the CPU 201 | Enable the thinning Disable the gate for the clock gate circuit 370d |
| Supply thinned clock signals to the ROM 204 and the system bus 208 | Enable the thinning Disable the gate for the clock gate circuit 370e |

TABLE 1-continued

| Detail of Clock Signal | Control Signal |
| --- | --- |
| Stop supply of clock signals to the image bus 209, the scanner image processing unit 206, the printer image processing unit 207, the image bus I/F 209, and the device I/F 213 | Disable the thinning Enable the gate for the clock gate circuit 370f |

In step S804, a particular clock gate circuit (the clock gate circuit 370f in the above-described example) in the clock signal generating unit 205 enables its gate based on the gate control signal from the clock setting holding unit 330. This stops supply of a clock signal to a predetermined functional module whose operation is allowed to be stopped.

In step S805, the clock thinning circuit 320 in the clock signal generating unit 205 enables the thinning based on the thinning control signal from the clock setting holding unit 330. This supplies a clock signal having a reduced frequency to a particular functional module whose operation speed is allowed to be slowed.

The foregoing has described the details of the control processing performed when the image forming apparatus 100 is to shift from the normal mode to the power-saving mode. As is obvious in FIG. 8, the processes in steps S804 and S805 are executed in parallel. By completing the processing of shifting to the power-saving mode as described above, the power consumption of the image forming apparatus 100 can be reduced.

Figure 9:
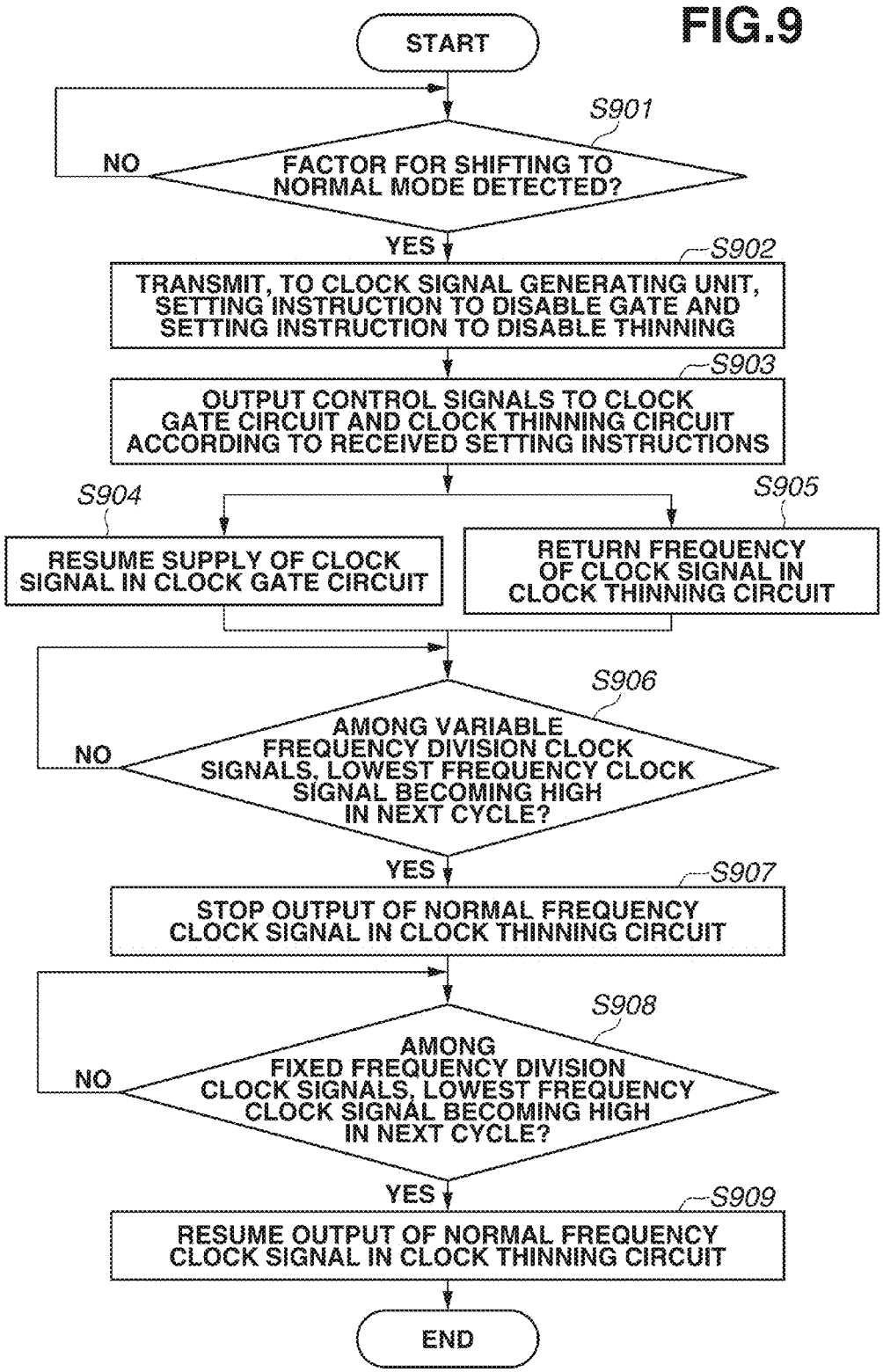
FIG. 9 is a flowchart illustrating a flow of control that is performed when the image forming apparatus is to return from the power-saving mode to the normal mode.

Next, control performed when the image forming apparatus 100 is to return from the power-saving mode to the normal mode will be described with reference to the flowchart of FIG. 9.

In step S901, the CPU 201 in the main controller 101 determines whether a factor for shifting from the power-saving mode to the normal mode has been detected. Examples of the factor include an event in which the image forming apparatus 100 has received a print job from the PC 105 via the LAN 106. If the CPU 201 determines that the factor has been detected (YES in step S901), the processing proceeds to step S902. If the CPU 201 determines that the factor has not been detected (NO in step S901), the CPU 201 continues the monitoring.

In step S902, the CPU 201 transmits, to the clock signal generating unit 205 via the system bus 208, a setting instruction to resume the supply of a particular clock signal and a setting instruction to return the frequency of a particular clock signal to normal.

In step S903, the clock setting holding unit 330 in the clock signal generating unit 205 holds the contents of both the received two types of setting instructions, and outputs predetermined control signals. More specifically, the clock setting holding unit 330 outputs, to a corresponding clock gate circuit (the clock gate circuit 370f in the above-described example), a gate control signal for disabling its gate. The clock setting holding unit 330 also outputs, to the clock thinning circuit 320, a thinning control signal for disabling the thinning.

In step S904, the particular clock gate circuit (the clock gate circuit 370f in the above-described example) in the clock signal generating unit 205 disables its gate based on the gate control signal from the clock setting holding unit 330.

In step S905, the clock thinning circuit 320 in the clock signal generating unit 205 disables the thinning based on the thinning control signal from the clock setting holding unit 330 to return the frequency of the clock signal to normal.

In step S906, the variable frequency division state monitoring unit 350 in the clock signal generating unit 205 determines whether, among the variable frequency division clock signals, the lowest frequency clock signal is in a state of becoming High in the next frequency division cycle. In order for the lowest frequency clock signal (the second bus clock signal in the above-described example) among the variable frequency division clock signals to become High in the next cycle, it is necessary for a variable frequency division clock signal having a higher frequency (the first bus clock signal in the above-described example), among the clock signals generated by the same clock source, to have become High once. This condition is satisfied, for example, at the timing 603 illustrated in FIG. 6B. If the variable frequency division state monitoring unit 350 determines that the lowest frequency clock signal among the variable frequency division clock signals is in the state of becoming High in the next frequency division cycle (YES in step S906), the variable frequency division state monitoring unit 350 notifies the clock thinning circuit 320 of the variable frequency division state information representing the determination, and the processing proceeds to step S907. On the other hand, if the variable frequency division state monitoring unit 350 determines that the lowest frequency clock signal has not yet been in the state (NO in step S906), the variable frequency division state monitoring unit 350 continues monitoring the frequency division state of the variable frequency division clock signals.

In step S907, the clock thinning circuit 320 stops (at the timing 603 illustrated in FIG. 6B) the output of the clock signal having the frequency that has been returned to normal in step S905.

In step S908, the fixed frequency division state monitoring unit 340 in the clock signal generating unit 205 determines whether, among the fixed frequency division clock signals, the lowest frequency clock signal is in a state of becoming High in the next frequency division cycle. At this point, it is the timing 604 illustrated in FIG. 6B when the lowest frequency clock signal (the first I/F clock signal in the above-described example) among the fixed frequency division clock signals becomes High in the next frequency division cycle. If the fixed frequency division state monitoring unit 340 determines that, among the fixed frequency division clock signals, the lowest frequency clock signal is in the state of becoming High in the next frequency division cycle (YES in step S908), the fixed frequency division state monitoring unit 340 notifies the clock thinning circuit 320 of the fixed frequency division state information representing the determination, and the processing proceeds to step S909. On the other hand, if the fixed frequency division state monitoring unit 340 determines that the lowest frequency clock signal has not yet been in the state (NO in step S908), the fixed frequency division state monitoring unit 340 continues monitoring the frequency division state of the fixed frequency division clock signals.

In step S909, the clock thinning circuit 320 resumes (at the timing 604 illustrated in FIG. 6B) the output of the clock signal having the frequency that has been returned to normal.

The foregoing has described the details of the control processing performed when the image forming apparatus 100 is to return from the power-saving mode to the normal mode. As is obvious from FIG. 9, the processes in steps S904 and 905 are executed in parallel. Phase adjustment between the fixed frequency division clock signals and the variable frequency division clock signals is quickly completed, enabling the image forming apparatus 100 to swiftly return to the normal mode.

According to the present exemplary embodiment, the phases of two or more types of clock signals can be synchronized with one another, and the time required for the phase adjustment can be shortened.

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-190390, filed Sep. 18, 2014, which is hereby incorporated by reference herein in its entirety.

What is claimed is:

1. A semiconductor integrated circuit comprising:
a first generation unit configured to generate, in response to an output clock signal of a clock source, a fixed frequency division clock signal having a fixed frequency;
a fixed frequency division state monitoring unit configured to monitor a frequency division state of the fixed frequency division clock signal;
a second generation unit configured to generate, in response to the output clock signal of the clock source, a variable frequency division clock signal having a variable frequency; and
a variable frequency division state monitoring unit configured to monitor a frequency division state of the variable frequency division clock signal,
wherein in a case where the frequency of the variable frequency division clock signal is returned from a frequency obtained by reducing a normal frequency to the normal frequency, when the variable frequency division state monitoring unit determines that the variable frequency division clock signal becomes a high state in a next cycle, output of the variable frequency division clock signal having the frequency returned to the normal frequency is stopped, and when the fixed frequency division state monitoring unit determines, after the output is stopped, that the fixed frequency division clock signal becomes a high state in a next cycle, the output of the variable frequency division clock signal having the frequency returned to the normal frequency is resumed.

2. The semiconductor integrated circuit according to claim 1, wherein the first generation unit and the second generation unit generate a plurality of the fixed frequency division clock signals and a plurality of the variable frequency division clock signals, respectively, and wherein in a case where the frequency of the variable frequency division clock signal is returned from the frequency obtained by reducing the normal frequency to the normal frequency, the variable frequency division state monitoring unit determines whether, among the plurality of variable frequency division clock signals, a variable frequency division clock signal having a lowest frequency becomes the high state in the next cycle, and the fixed frequency division state monitoring unit determines whether, among the plurality of fixed frequency division clock signals, a fixed frequency division clock signal having a lowest frequency becomes the high state in the next cycle.

3. The semiconductor integrated circuit according to claim 1, wherein the second generation unit generates a thinned clock signal obtained by thinning the output clock signal of the clock source, and generates the variable frequency division clock signal based on the thinned clock signal.

4. A method for controlling clock signals in a semiconductor integrated circuit, the method comprising:

generating, in response to an output clock signal of a clock source, a fixed frequency division clock signal having a fixed frequency;

monitoring a frequency division state of the fixed frequency division clock signal;

generating, in response to the output clock signal of the clock source, a variable frequency division clock signal having a variable frequency;

monitoring a frequency division state of the variable frequency division clock signal; and returning the frequency of the variable frequency division clock signal from a frequency obtained by reducing a normal frequency to the normal frequency, wherein, in the returning, output of the variable frequency division clock signal having the frequency returned to the normal frequency is stopped when the variable frequency division clock signal is determined to become a high state in a next cycle in the monitoring of the frequency division state of the variable frequency division clock signal, and the output of the variable frequency division clock signal having the frequency returned to the normal frequency is resumed when the fixed frequency division clock signal is determined, after the output is stopped, to become in a high state in a next cycle in the monitoring of the frequency division state of the fixed frequency division clock signal.

* * * * *